(12) United States Patent
Rana et al.

(10) Patent No.: US 7,075,379 B2
(45) Date of Patent: Jul. 11, 2006

(54) LOW SUPPLY-SENSITIVE AND WIDE TUNING-RANGE CMOS LC-TANK VOLTAGE-CONTROLLED OSCILLATOR MONOLITHIC INTEGRATED CIRCUIT

(75) Inventors: Ram Singh Rana, Singapore (SG); Zhou Xiangdong, Zhejiang (CN); Lian Yong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 267 days.

(21) Appl. No.: 10/624,679

(22) Filed: Jul. 23, 2003

(65) Prior Publication Data
US 2005/0017813 A1    Jan. 27, 2005

(51) Int. Cl.
*H03B 5/12*    (2006.01)
(52) U.S. Cl. .......................... 331/117 FE; 331/117 R; 331/177 V; 331/185
(58) Field of Classification Search .............. 331/36 C, 331/117 R, 117 FE, 117 D, 177 V, 185
See application file for complete search history.

(56) References Cited

U.S. PATENT DOCUMENTS

| | | | |
|---|---|---|---|
| 5,635,880 A | 6/1997 | Brown | |
| 5,936,476 A | 8/1999 | Iravani | |
| 5,959,504 A | 9/1999 | Wang | |
| 6,011,443 A | 1/2000 | Chen et al. | |
| 6,037,842 A | 3/2000 | Bryan et al. | |
| 6,100,770 A | 8/2000 | Litwin et al. | |
| 6,104,254 A | 8/2000 | Iravani | |
| 6,107,893 A | 8/2000 | Forbes | |
| 6,219,397 B1 * | 4/2001 | Park | 375/376 |
| 6,225,871 B1 | 5/2001 | Chien | |
| 6,249,191 B1 | 6/2001 | Forbes | |
| 6,288,616 B1 | 9/2001 | Wang | |

(Continued)

OTHER PUBLICATIONS

M. Tiebout, "Low-Power Low-Phase-Noise Differentially Tuned Quadrature VCO Design in Standard CMOS", IEEE J. Solid-State Circuits, vol. 36, No. 7, Jul. 2001.

(Continued)

*Primary Examiner*—David Mis
(74) *Attorney, Agent, or Firm*—Nath & Associates PLLC; Harold L. Novick

(57) ABSTRACT

A voltage-controlled oscillator circuit connected to supply and reference voltage for radio frequency operation is disclosed. The circuit comprises at least one inductor and at least one varactor connected in parallel with the at least one inductor. The circuit also comprises a pair of p-channel MOS transistors connected across the at least one varactor, each p-channel MOS transistor having source, drain, and gate terminals, wherein the drain terminal of the first of the pair of p-channel MOS transistors is connected to the gate terminal of the second of the pair of p-channel MOS transistors and the drain terminal of second of the pair of MOS transistors being connected to the gate terminal of the first of the pair of MOS transistors. The circuit further comprises biasing means for providing a biasing current to the voltage-controlled oscillator circuit, the biasing means configured according to one of a biasing n-channel MOS transistor connected to the supply voltage and a biasing p-channel MOS transistor connected to the reference voltage.

16 Claims, 6 Drawing Sheets

U.S. PATENT DOCUMENTS

| | | | |
|---|---|---|---|
| 6,353,368 B1 | 3/2002 | Iravani | |
| 6,469,586 B1 | 10/2002 | Rogers et al. | |
| 6,542,043 B1 * | 4/2003 | Cao | 331/117 FE |
| 6,621,362 B1 * | 9/2003 | Momtaz et al. | 331/117 R |
| 6,639,481 B1 * | 10/2003 | Ravi et al. | 331/177 V |
| 6,650,195 B1 * | 11/2003 | Brunn et al. | 331/177 V |

OTHER PUBLICATIONS

J. Bhattacharjee, D. Mukherjee, E. Gebara, Su. Nuttinck, and J. Laskar, "A 5.8 GHz Fully Integrated Low Power Low Phase Noise CMOS LC VCO For WLAN Applications", 2002 IEEE MTT-S Digest.

* cited by examiner

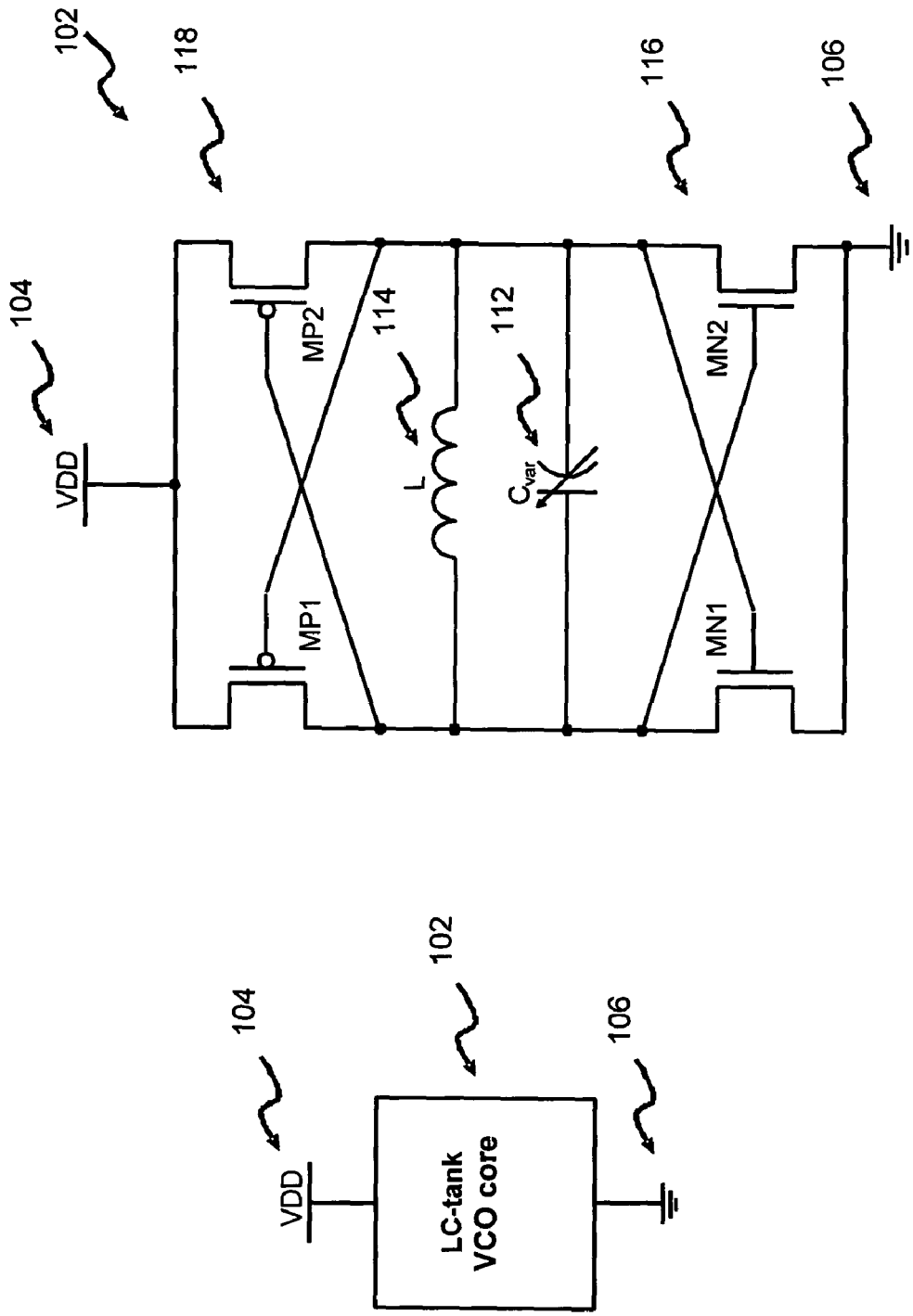
FIG. 1B – PRIOR ART
FIG. 1A – PRIOR ART

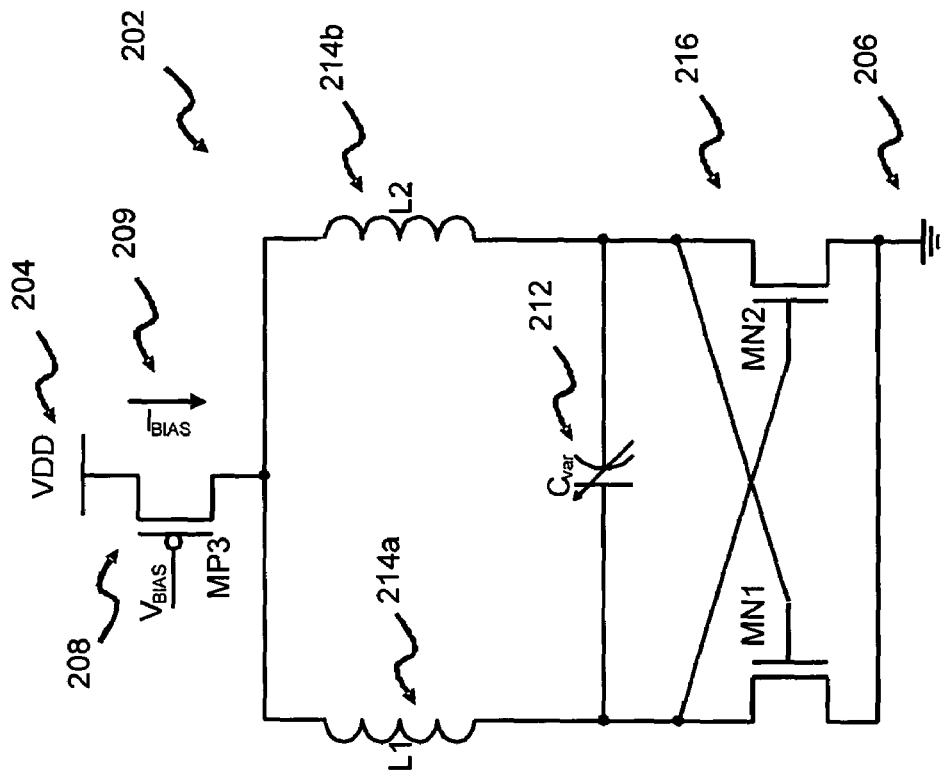
FIG. 2B – PRIOR ART
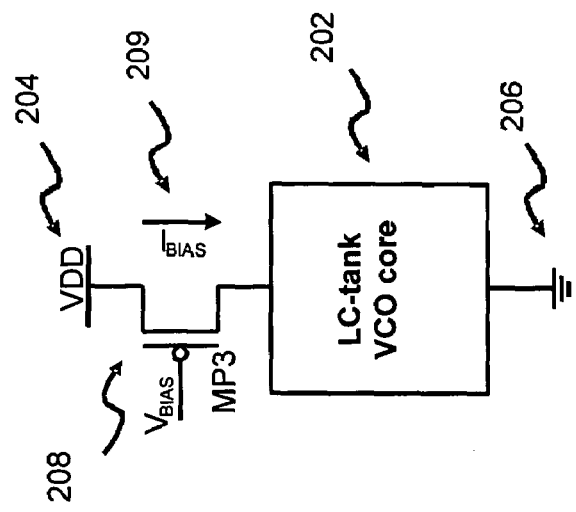
FIG. 2A – PRIOR ART

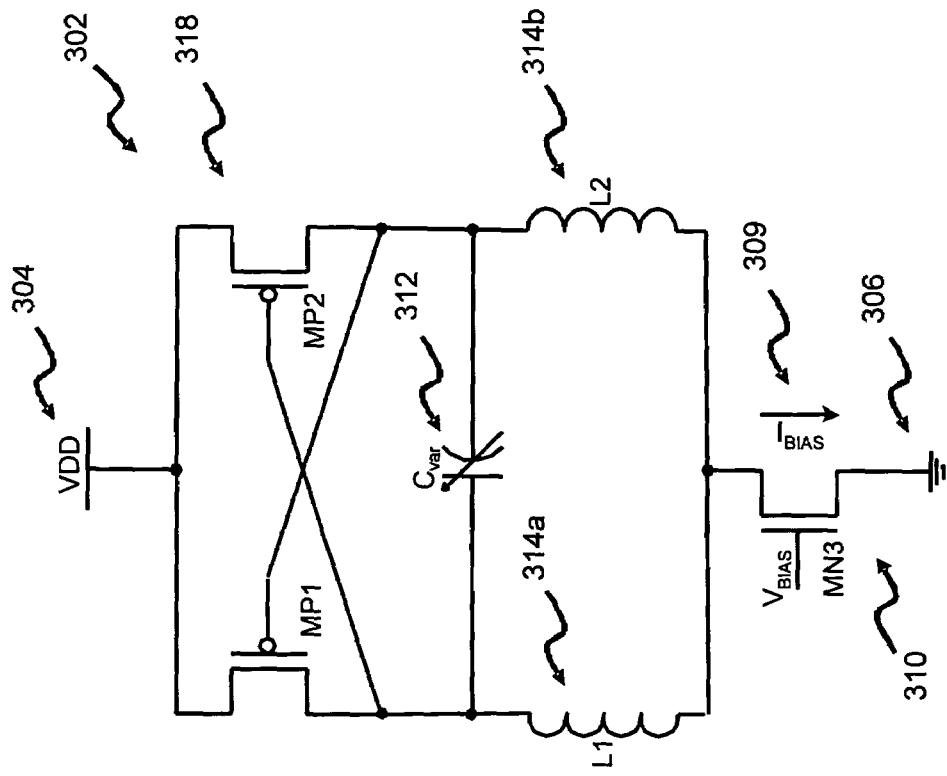
FIG. 3B – PRIOR ART
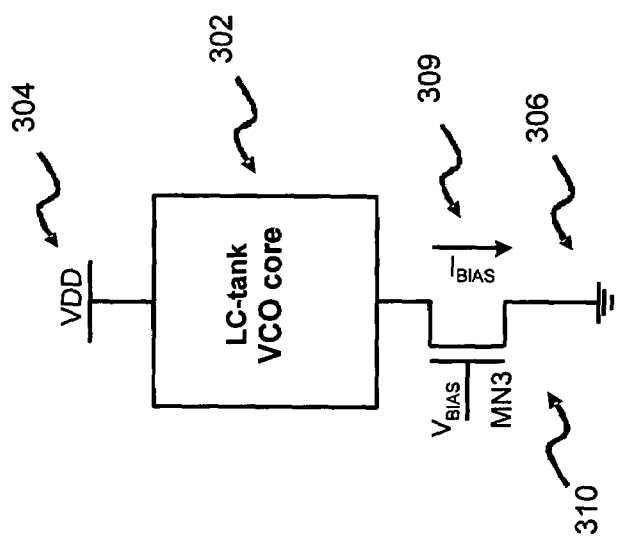
FIG. 3A – PRIOR ART

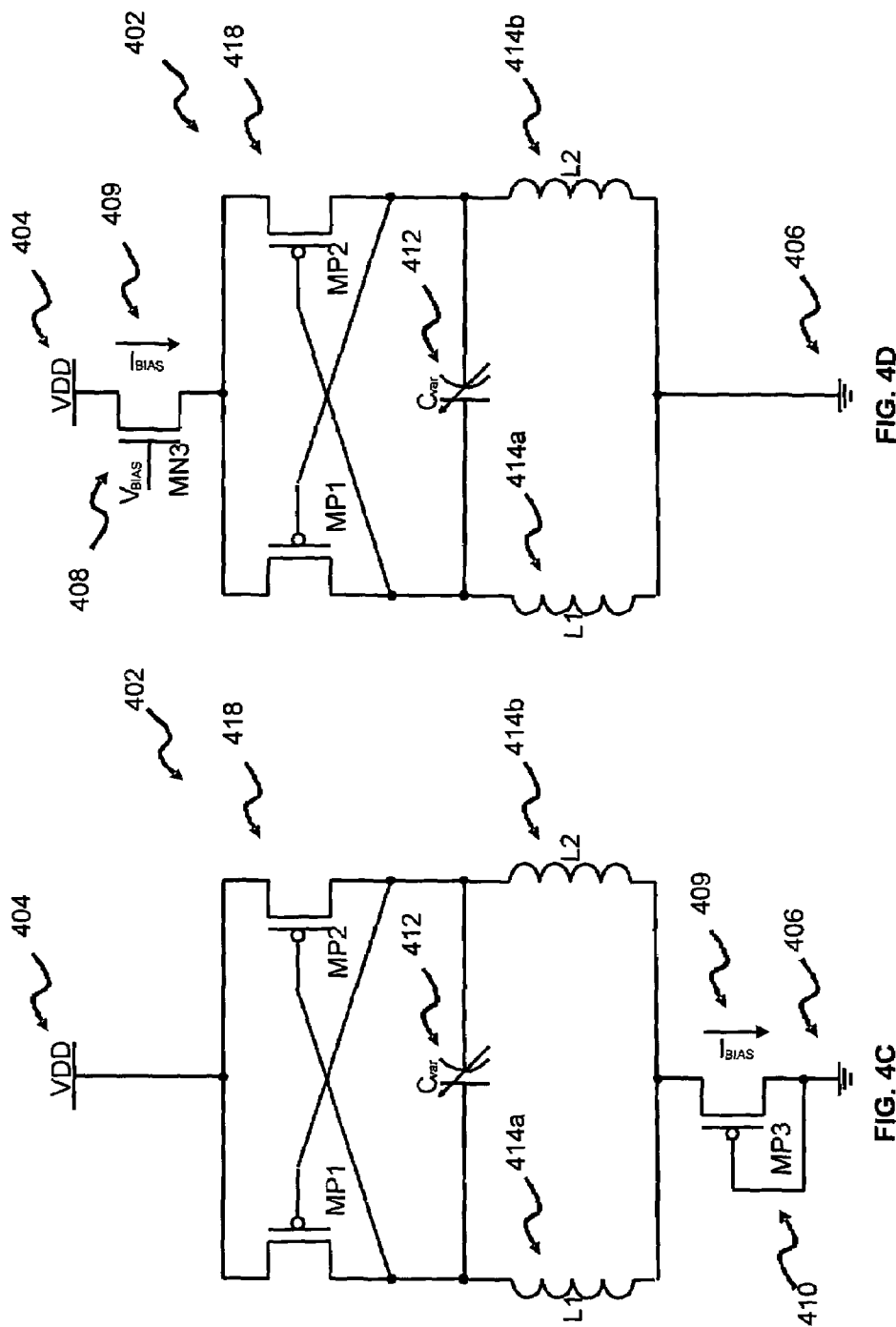

LOW SUPPLY-SENSITIVE AND WIDE TUNING-RANGE CMOS LC-TANK VOLTAGE-CONTROLLED OSCILLATOR MONOLITHIC INTEGRATED CIRCUIT

FIELD OF INVENTION

The invention relates to voltage-controlled oscillator (VCO) circuits. More particularly, the invention relates to a monolithic integrated circuit (IC) for a low supply-sensitive and wide tuning-range VCO for low phase-noise and low power radio frequency (RF) applications using complementary-symmetry metal-oxide-semiconductor (CMOS) transistors and one LC-tank.

BACKGROUND

Conventional CMOS-based low power and low phase-noise VCO monolithic IC topologies commonly used in RF applications are shown in FIGS. 1, 2 and 3. A conventional LC-tank VCO core 102 shown in FIGS. 1a and 1b is directly biased using a supply voltage (VDD) 104 and a reference voltage (ground) 106 without any biasing component. In the LC-tank VCO core 102, an n-channel MOS transistor pair 116 and a p-channel MOS transistor pair 118 are connected to MOS varactor(s) 112 and inductor(s) 114 for oscillation operation. A control voltage is applied to the MOS varactor(s) 112 to tune the operational frequency of the LC-tank VCO core 102.

In FIGS. 2a and 2b, a conventional LC-tank VCO core 202 is biased using VDD 204 and ground 206 through a p-channel MOS biasing transistor 208 connected between the VDD 204 and the LC-tank VCO core 202. A biasing voltage is applied to the gate terminal of the p-channel MOS biasing transistor 208 to effect control over a biasing current 209 for biasing the LC-tank VCO core 202. In the LC-tank VCO core 202, an n-channel MOS transistor pair 216 is connected across MOS varactor(s) 212 and a pair of inductors 214a and 214b connected in series, the n-channel MOS transistor pair 216, the MOS varactor(s) 212 and the pair of inductors 214a and 214b operating together to provide oscillation. A control voltage is applied to the MOS varactor(s) 212 to tune the operational frequency of the LC-tank VCO core 202. Also, an n-channel MOS transistor pair 216 is employed in the LC-tank VCO core 202 to provide a negative transconductance element to compensate for the resistance loss inherent in the LC-tank VCO core 202.

In FIGS. 3a and 3b, a conventional LC-tank VCO core 302 is biased using VDD 304 and ground 306 through an n-channel MOS biasing transistor 310 connected between the LC-tank VCO core 302 and the ground 306 to provide a biasing current 309. A biasing voltage is applied to the gate terminal of the n-channel MOS biasing transistor 310 to effect control over the biasing current 309. In the LC-tank VCO core 302, a p-channel MOS transistor pair 318 is connected across MOS varactor(s) 312 and a pair of inductors 314a and 314b connected in series, the p-channel MOS transistor pair 318, the MOS varactor(s) 312 and the pair of inductors 314a and 314b together performing oscillation operation. A control voltage is applied to the MOS varactor(s) 312 to tune the operational frequency of the LC-tank VCO core 302. Also, a p-channel MOS transistor pair 318 is employed in the LC-tank VCO core 302 to provide a negative transconductance element to compensate for the resistance loss inherent in the LC-tank VCO core 302.

Due to variations in biasing techniques for conventional VCO circuit topologies, the common limitations in these topologies include poor merit of frequency pushing, which depends on the sensitivity of LC-tank VCO cores to power supplies, and limited utilization of linear range of MOS varactor(s) enabling only limited frequency tuning range of the VCO circuits. There is therefore an apparent need for VCO circuits that provide improved frequency pushing and wider frequency tuning range.

SUMMARY

Embodiments of the invention disclosed herein possess improved performance relating to frequency pushing while achieving performance on low phase noise and low power consumption. Additionally, a wider frequency tuning range is also obtained while achieving low phase noise parformance and low power comsumption.

In accordance with a first aspect of the invention, a voltage-controlled oscillator circuit connected to supply and reference voltages for radio frequency operation is disclosed, the circuit comprising at least one inductor; at least one varactor connected in parallel with the at least one inductor; a pair of p-channel MOS transistors connected across the at least one varactor, each p-channel transistor having source, dram, and gate terminals, wherein the drain terminal of the first of the pair of p-channel MOS transistors is connected to the gate terminal of the second of the pair of p-channel MOS transistors and the drain terminal of second of the pair of MOS transistors is connected to the gate terminal of the first of the pair of MOS transistors; and biasing means for providing a biasing current to the voltage-controlled oscillator circuit and for substantially widening the tuning range thereof, the biasing means configured according to a biasing n-channel transistor connected to the supply voltage and a self-biasing p-channel transistor connected to the reference voltage, wherein the biasing means is connected to the pair of p-channel MOS transistors and the at least one inductor.

In accordance with a second aspect of the invention, a method for configuring a voltage-controlled oscillator circuit connected to supply and reference voltages for radio frequency operation, the method comprising the steps of providing at least one inductor; connecting at least one varactor in parallel with the at least one inductor; connecting a pair of p-channel MOS transistors across the at least one varactor, each p-channel MOS transistor having source, drain, and gate terminals, wherein the drain terminal of the first of the pair of p-channel MOS transistors is connected to the gate terminal of the second of the pair of p-channel MOS transistors and the drain terminal of second of the pair of p-channel MOS transistors is connected to the gate terminal of the first of the pair of p-channel MOS transistors; and providing biasing means for providing a biasing current to the voltage-controlled oscillator circuit and for substantially widening the tuning range thereof, the biasing means being configured according to a biasing n-channel transistor connected to the supply voltage and a self-biasing p-channel transistor connected to the reference voltage, wherein the biasing means is connected to the pair of p-channel MOS transistors and the at least one inductor.

BRIEF DESCRIPTION OF DRAWINGS

Embodiments of the invention are described hereinafter with reference to the drawings, in which:

FIGS. 1a and 1b illustrate a conventional VCO circuit with an LC-tank VCO core;

FIGS. 2a and 2b illustrate another conventional VCO circuit with an LC-tank VCO core;

FIGS. 3a and 3b illustrate a further conventional VCO circuit with an LC-tank VCO core;

FIG. 4c illustrates a VCO circuit with an LC-tank VCO core according to another embodiment of the invention;

FIG. 4d illustrates a VCO circuit with an LC-tank VCO core according to a further embodiment of the invention;

DETAILED DESCRIPTION

Embodiments of the invention are described with reference to FIGS. 4a to 4d. The preferred embodiment is described with reference to FIGS. 4a and 4b. In such an embodiment, an LC-tank VCO core is biased using two MOS transistors. In an alternate embodiment described with reference to FIG. 4c, an LC-tank VCO core is biased using a p-channel MOS transistor connected to a reference voltage such as ground. In a further alternative embodiment described with reference to FIG. 4d, an LC-tank VCO core is biased using an n-channel MOS transistor connected to a supply voltage such as VDD.

Figure 4B:
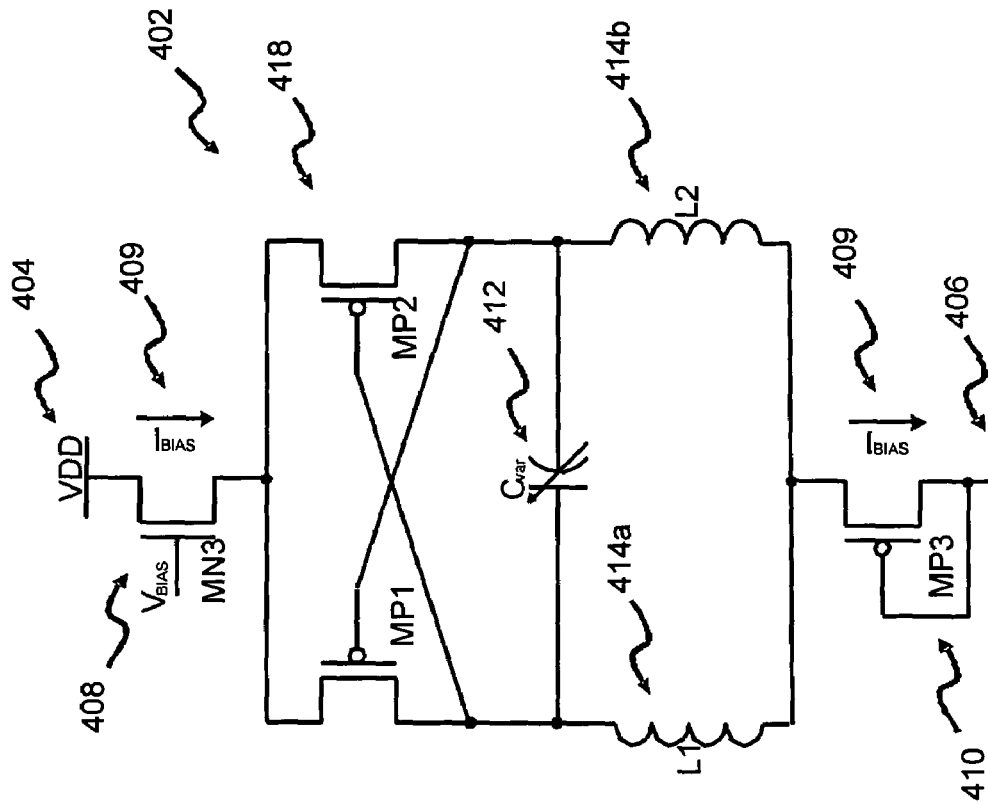
FIGS. 4a and 4b illustrate a VCO circuit with an LC-tank VCO core according to a preferred embodiment of the invention.
Figure 4A:
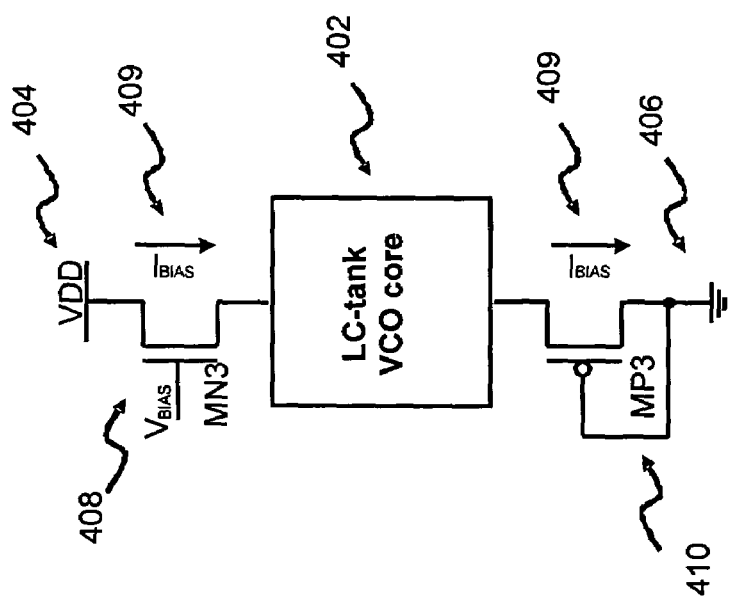

In FIGS. 4a and 4b, an LC-tank VCO core 402 is biased using VDD 404 and ground 406 through an n-channel MOS biasing transistor 408 connected between the LC-tank VCO core 402 and the VDD 404 to provide a biasing current 409. A biasing voltage is applied to the gate terminal of the n-channel MOS biasing transistor 408 to effect control over the biasing current 409. The LC-tank VCO core 402 is further biased through a p-channel MOS biasing transistor 410 connected between the LC-tank VCO core 402 and the ground 404. The gate terminal of the p-channel MOS biasing transistor 410 is connected to the drain terminal of the p-channel MOS biasing transistor 410 for providing self-biasing.

In the LC-tank VCO core 402, a p-channel MOS transistor pair 418 is connected across the MOS varactor(s) 412 and a pair of inductors 414a and 414b connected in series; the p-channel MOS transistor pair 418, the MOS varactor(s) 412 and the pair of inductors 414a and 414b together performing oscillation operation.

A control voltage is applied to the MOS varactor(s) 412 to tune the operational frequency of the LC-tank VCO core 402. Also, a p-channel MOS transistor pair 418 is employed in the LC-tank VCO core 402 to provide a negative transconductance element to compensate for the resistance loss inherent in the LC-tank VCO core 402.

The source terminal of the n-channel MOS biasing transistor 408 is connected to the sources of the p-channel MOS transistor pair 418 while the source terminal of the p-channel MOS biasing transistor 410 is connected to the inter-connection between the pair of inductors 414a and 414b.

The n-channel MOS biasing transistor 408 operates in the saturation region and provides the biasing current 409 to the LC-tank 402. By using an n-channel MOS transistor in this instance, any change in the biasing current 409 with respect to any change in the VDD 404 is reduced. Thus, the n-channel MOS biasing transistor 408 offers a simple solution to suppress noise from the VDD 404 and as a result provides a low supply-sensitive VCO circuit with improved merit of frequency pushing.

Herein, frequency pushing is defined as the sensitivity of a VCO circuit to its supply voltage and can be expressed as following:

$$\frac{\left(\frac{\Delta f}{f}\right)}{\Delta V_{DD}} \% / V$$

where f is the center frequency given a power supply of $V_{DD}$, and $\Delta f$ is the oscillation frequency variation due to $\Delta V_{DD}$, the voltage change in the power supply $V_{DD}$.

Further improvement in frequency pushing can be achieved by increasing the channel length of the n-channel MOS biasing transistor 408 due to a lower channel length modulation effect in the longer channel devices.

The self-biasing p-channel MOS biasing transistor 410 is used to bias the MOS varactor(s) 412 to enhance utilization of linear range of the MOS varactor(s) 412. By connecting the gate terminal of the p-channel MOS biasing transistor 410 to the ground 406 exploits further usage of the linear range of the MOS varactor(s) 412 resulting in wide frequency tuning range of the VCO circuit. The following relationship shows how the variations in capacitance of the MOS varactor(s) 412 are related to the frequency tuning range of the VCO circuit:

$$\Delta \omega = \frac{1}{\sqrt{LC}} - \frac{1}{\sqrt{L(C \pm C_{var})}}$$

$$= \omega_0 \left(1 - \frac{1}{\sqrt{1 \pm \frac{C_{var}}{C}}}\right)$$

$$= \omega_0 \left(1 - \frac{1}{\sqrt{1 \pm C_{var}\omega_0^2 L}}\right)$$

$$\approx \pm \frac{1}{2} \omega_0^3 L C_{var}$$

where $\omega_0$ is the center frequency, L is the total inductance in the LC-tank, C is the total capacitance in the LC-tank at the center frequency, and $C_{var}$ is the maximum variable capacitance tuned by control voltage.

In FIG. 4c, an LC-tank VCO core 402 is biased using VDD 404 and ground 406 through a p-channel MOS biasing transistor 410 connected between the LC-tank VCO core 402 and the ground 406 to provide a biasing current 409. The gate terminal of the p-channel MOS biasing transistor 410 is connected to the drain terminal of the p-channel MOS biasing transistor 410 for providing self-biasing.

In the LC-tank VCO core 402, a p-channel MOS transistor pair 418 is connected across the MOS varactor(s) 412 and a pair of inductors 414a and 414b connected in series; the p-channel MOS transistor pair 418, the MOS varactor(s) 412 and the pair of inductors 414a and 414b together performing oscillation operation.

A control voltage is applied to the MOS varactor(s) 412 to tune the operational frequency of the LC-tank VCO core 402. Also, a p-channel MOS transistor pair 418 is employed in the LC-tank VCO core 402 to provide a negative transconductance element to compensate for the resistance loss inherent in the LC-tank VCO core 402.

The VDD 404 is connected to the drains of the p-channel MOS transistor pair 418 while the source terminal of the p-channel MOS biasing transistor 410 is connected to the inter-connection between the pair of inductors 414a and 414b.

In FIG. 4d, an LC-tank VCO core 402 is biased using VDD 404 and ground 406 through an n-channel MOS biasing transistor 408 connected between the LC-tank VCO core 402 and the VDD 404 to provide a biasing current 409. A biasing voltage is applied to the gate terminal of the n-channel MOS biasing transistor 408 to effect control over the biasing current 409.

In the LC-tank VCO core 402, a p-channel MOS transistor pair 418 is connected across the MOS varactor(s) 412 and a pair of inductors 414a and 414b connected in series; the p-channel MOS transistor pair 418, the MOS varactor(s) 412 and the pair of inductors 414a and 414b together performing oscillation operation.

A control voltage is applied to the MOS varactor(s) 412 to tune the operational frequency of the LC-tank VCO core 402. Also, a p-channel MOS transistor pair 418 is employed in the LC-tank VCO core 402 to provide a negative transconductance element to compensate for the resistance loss inherent in the LC-tank VCO core 402.

The source terminal of the n-channel MOS biasing transistor 408 is connected to the sources of the p-channel MOS transistor pair 418 while the ground 406 is connected to the inter-connection between the pair of inductors 414a and 414b.

Figure 5B:
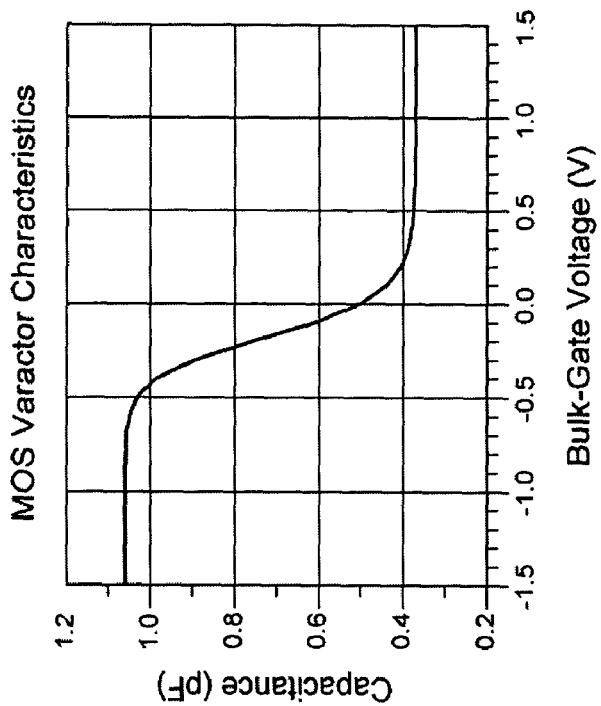
FIG. 5b illustrates characteristics of a MOS varactor used in the VCO circuit of FIGS. 4a, 4b, 4c and 4d.
Figure 5A:
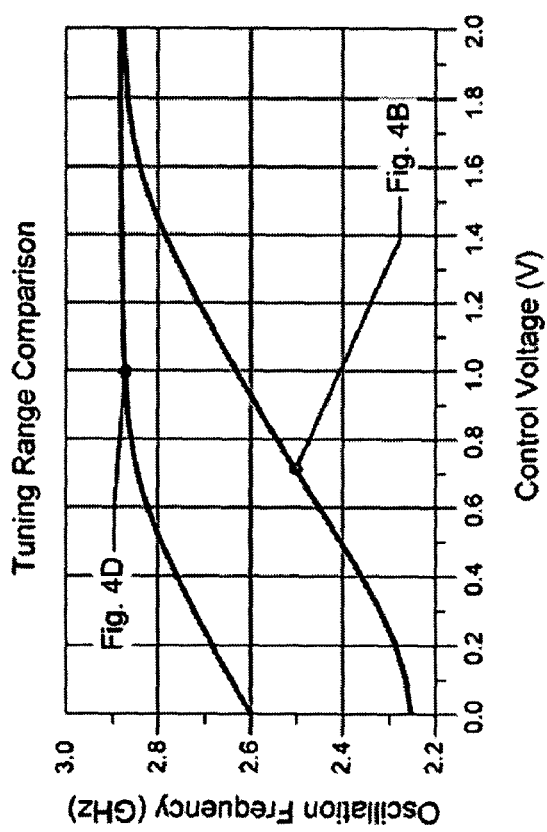
FIG. 5a in conjunction with Tables 1 and 2 illustrate simulated performance of the VCO circuit of FIGS. 4a and 4b.

The VCO circuit according to the preferred embodiment is simulated using 0.35 μm standard CMOS technology parameters. A typical set of simulated performance shown in Table 1 and FIG. 5a indicate that: center frequency=2.632 GHz, frequency tuning range=624 MHz, phase noise @ 100 kHz offset from center frequency=−103 dBc/Hz, frequency pushing=0.25%/V and supply current=4 mA at 3V supply voltage using MOS varactors having characteristics as shown in FIG. 5b. The further simulation results as shown in Table 2 indicate that the frequency pushing performance is improved by increasing the channel length of the n-channel MOS biasing transistor 408.

In the foregoing manner, there are described VCO circuits that provide improved frequency pushing and wider frequency tuning range. Although only a number of embodiments of the invention are disclosed, it becomes apparent to one skilled in the art in view of this disclosure that numerous changes and/or modification can be made without departing from the scope and spirit of the invention. For example, although all MOS transistors used in the foregoing embodiments are enhancement type MOS transistors, these may perform similar operation if substituted by depletion type MOS transistors. Furthermore, all MOS transistors used in the embodiments may perform similar operation if substituted by devices or circuits having the like characteristics such as JFET transistors.

TABLE 1

Comparison of different configurations

| Parameters | FIG. 4B (proposed) | FIG. 4C (proposed) | FIG. 4D (proposed) | FIG. 3 (prior art) | FIG. 2 (prior art) | Unit |
| --- | --- | --- | --- | --- | --- | --- |
| Center Frequency | 2.632 | 2.625 | 2.784 | 2.594 | 3.337 | GHz |
| Frequency Tuning Range | 23.7 | 23.9 | 10.0 | 25.0 | 35.7 | % |
| Phase Noise at 100 KHz offset from Center Frequency | −103.0 | −103.4 | −97.8 | −100.6 | −75.7 | dBc/Hz |
| Frequency Pushing | 0.25 | 16.84 | 0.14 | 20.49 | 82.48 | %/V |
| DC Power Current | 4 | 4 | 4 | 4 | 4 | mA |
| Power Supply | 3 | 3 | 3 | 3 | 3 | V |

TABLE 2

Frequency Pushing vs. Channel Length of transistor MN3 in FIG. 4B. First row corresponds to FIG. 4C.

| Transistor Sizes | | Frequency | |
| --- | --- | --- | --- |
| Channel Length | Channel Width | Pushing | Comment |
| N/A | N/A | 16.84%/V | Frequency Pushing is high |
| 0.35 μm | 10*85.1 μm | 0.47%/V | Frequency Pushing is |
| 0.40 μm | 10*448 μm | 0.25%/V | low and improves with |
| 0.45 μm | 10*1576 μm | 0.15%/V | increase in L |
| 0.50 μm | 10*3697 μm | 0.10%/V | |

The invention claimed is:

1. A voltage-controlled oscillator circuit connected to supply and reference voltages for radio frequency operation, comprising:

at least one inductor;

at least one varactor connected in parallel with the at least one inductor;

a pair of p-channel MOS transistors connected across the at least one varactor, each p-channel transistor having source, drain, and gate terminals, wherein the drain terminal of the first of the pair of p-channel MOS transistors is connected to the gate terminal of the second of the pair of p-channel MOS transistors and the drain terminal of the second of the pair of MOS transistors is connected to the gate terminal of the first of the pair of MOS transistors; and biasing means for providing a biasing current to the voltage-controlled oscillator circuit and for substantially widening the tuning range thereof, the biasing means being configured according to a biasing n-channel MOS transistor connected to the supply voltage and self-biasing p-channel MOS transistor connected to the reference voltage, wherein the biasing means is connected to the pair of p-channel MOS transistors and the at least one inductor.

2. The voltage-controlled oscillator circuit of claim 1, wherein when the biasing means is configured according to the biasing n-channel MOS transistor connected to the supply voltage, the biasing n-channel MOS transistor having source, drain, and gate terminals, the drain terminal of the biasing n-channel MOS transistor is connected to the supply voltage.

3. The voltage-controlled oscillator circuit of claim 2, wherein the gate terminal of the biasing n-channel MOS transistor is connected to a biasing voltage.

4. The voltage-controlled oscillator circuit of claim 3, wherein the source terminal of the biasing n-channel MOS transistor is connected to the source terminals of the pair of p-channel MOS transistors.

5. The voltage-controlled oscillator circuit of claim 4, wherein the at least one inductor is configured according to a pair of first and second inductors connected in series and the connection therebetween is connected to the reference voltage.

6. The voltage-controlled oscillator circuit of claim 1, wherein when the biasing means is configured according to the biasing p-channel MOS transistor connected to the reference voltage, the biasing p-channel MOS transistor having source, drain and gate terminals, the drain terminal of the biasing p-channel MOS transistor is connected to the reference voltage.

7. The voltage-controlled oscillator circuit of claim 6, wherein the gate and drain terminals of the biasing p-channel MOS transistor are connected.

8. The voltage-controlled oscillator circuit of claim 7, wherein the at least one inductor is configured according to a pair of first and second inductors connected in series.

9. The voltage-controlled oscillator circuit of claim 8, wherein the source terminal of the biasing p-channel MOS transistor is connected to the inter-connection between the pair of first and second inductors.

10. The voltage-controlled oscillator circuit of claim 9, wherein the source terminals of the pair of p-channel MOS transistors are connected to the supply voltage.

11. A method for configuring a voltage-controlled oscillator circuit connected to supply and reference voltages for radio frequency operation, the method comprising the steps of:
   providing at least one inductor;
   connecting at least one varactor in parallel with the at least one inductor;
   connecting a pair of p-channel MOS transistors across the at least one varactor, each p-channel transistor having source, drain, and gate terminals, wherein the drain terminal of the first of the pair of p-channel MOS transistors is connected to the gate terminal of the second of the pair of p-channel MOS transistors and the drain terminal of the second of the pair of p-channel MOS transistors is connected to the gate terminal of the first of the pair of p-channel MOS transistors; and
   providing biasing means for providing a biasing current to the voltage-controlled oscillator circuit and for substantially widening the tuning range thereof, the biasing means being configured according to a biasing n-channel MOS transistor connected to the supply voltage and a self-biasing p-channel MOS transistor connected to the reference voltage,
   wherein the biasing means is connected to the pair of p-channel MOS transistors and the at least one inductor.

12. The method as in claim 11, the biasing p-channel MOS transistor having source, drain and gate terminals and the drain terminal of the biasing p-channel MOS transistor is connected to the reference voltage, further comprising the step of connecting the gate and drain terminals of the biasing p-channel MOS transistor.

13. The method as in claim 11, the biasing n-channel MOS transistor having source, drain and gate terminals and the drain terminal of the biasing n-channel MOS transistor is connected to the supply voltage, further comprising the step of connecting the gate terminal of the biasing n-channel MOS transistor to a biasing voltage.

14. The method as in claim 11, further comprising the step of connecting the source terminal of the biasing n-channel MOS transistor to the source terminals of the pair ofp-channel MOS transistors.

15. The method as in claim 11, further comprising the step of configuring the at least one inductor according to a pair of first and second inductors connected in series.

16. The method as in claim 15, further comprising the step of connecting the source terminal of the biasing p-channel MOS transistor to the inter-connection between the pair of first and second inductors.

* * * * *